United States Patent
Moon et al.

(10) Patent No.: US 7,595,967 B1
(45) Date of Patent: Sep. 29, 2009

(54) METHOD FOR FABRICATING A SPACER LAYER FOR A MAGNETORESISTIVE ELEMENT

(75) Inventors: Ki-Seok Moon, Pleasanton, CA (US); Chang-Man Park, Mountain View, CA (US)

(73) Assignee: Western Digital (Fremont), LLP, Fremont, CA (US)

( * ) Notice: Subject to any disclaimer, the term of this patent is extended or adjusted under 35 U.S.C. 154(b) by 582 days.

(21) Appl. No.: 10/936,172

(22) Filed: Sep. 7, 2004

(51) Int. Cl.
*G11B 5/33* (2006.01)
(52) U.S. Cl. ............................ 360/324.2; 29/603.01
(58) Field of Classification Search ................... None
See application file for complete search history.

(56) References Cited

U.S. PATENT DOCUMENTS

| | | | |
|---|---|---|---|
| 4,066,740 A | 1/1978 | Erickson | |
| 4,118,873 A | 10/1978 | Rothchild | |
| 4,894,353 A | 1/1990 | Ibok | |
| 5,629,922 A | 5/1997 | Moodera et al. | |
| 5,835,314 A | 11/1998 | Moodera et al. | |
| 5,953,591 A | 9/1999 | Ishihara et al. | |
| 6,519,123 B1 * | 2/2003 | Sugawara et al. | 360/324.2 |
| 6,574,079 B2 | 6/2003 | Sun et al. | |
| 6,657,829 B2 | 12/2003 | Nakazawa et al. | |
| 6,713,801 B1 | 3/2004 | Sin et al. | |
| 6,754,052 B2 | 6/2004 | Asida et al. | |
| 2002/0054462 A1 | 5/2002 | Sun et al. | |
| 2002/0085321 A1 | 7/2002 | Carey et al. | |
| 2002/0163764 A1 | 11/2002 | Nakazawa et al. | |
| 2003/0218058 A1 | 11/2003 | Shaw et al. | |

OTHER PUBLICATIONS

K. Moon, et al., "PtMn-based spin-dependent tunneling materials with thin alumina barrier fabricated by two-step natural oxidation", J. Appl. Phys., vol. 91, No. 10, May 15, 2002, pp. 7965-7967.
Z.G. Zhang, et al., "Effect of natural oxidation conditions on low resistance spin tunnel junctions", J. Appl. Phys., vol. 91, No. 10, May 15, 2002, pp. 8786-8788.
J. Wang, et al., "Low-resistance spin-dependent tunnel junctions with ZrAlOx barriers," Appl. Phys. Lett., vol. 79, No. 27, Dec. 31, 2001, pp, 4553-4555.
J. R. Childress, et al., "Low resistance IrMn and PtMn tunnel valves for recording head applications", J. Appl. Phys., vol. 89, No. 11, Jun. 1, 2001, pp. 7353-7355.
K. Sin, et al., "Low Resistance Spin-Dependent Tunneling Junctions with Naturally Oxidized Tunneling Barrier", IEEE Trans. Magn., vol. 36, No. 5, Sep. 2000, pp. 2818-2820.
P. P. Freitas, et al., "Spin Dependent Tunnel Junctions for Memory and Read-Head Applications", IEEE Trans. Magn. 36, vol. 36, No. 5, Sep. 2000, pp. 2796-2801.
S. Araki, et al., "Fabrication and Electric Properties of Lapped Type of TMR Heads for —50Gb/in2 and Beyond", IEEE Trans. Magn., vol. 38, No. 1, Jan. 2002, pp. 72-77.

* cited by examiner

*Primary Examiner*—David D Davis
(74) *Attorney, Agent, or Firm*—Virtual Law Partners, LLP (57) ABSTRACT

A method and system for manufacturing a spacer layer in a magnetoresistive element are described. The spacer layer resides between a free layer and a pinned layer. The method and system include providing a first metallic layer and oxidizing the first metallic layer in a first environment including at least oxygen and a first gas inert with respect to the first metallic layer. The method and system further include providing a second metallic layer and oxidizing the second metallic layer in a second environment including at least oxygen and a first gas inert with respect to the first metallic layer.

14 Claims, 6 Drawing Sheets

METHOD FOR FABRICATING A SPACER LAYER FOR A MAGNETORESISTIVE ELEMENT

FIELD OF THE INVENTION

The present invention relates to magnetic recording technology, and more particularly to a method and system for providing a tunneling magnetoresistive element that has an improved spacer layer between a free layer and a pinned layer.

BACKGROUND OF THE INVENTION

Figure 1:
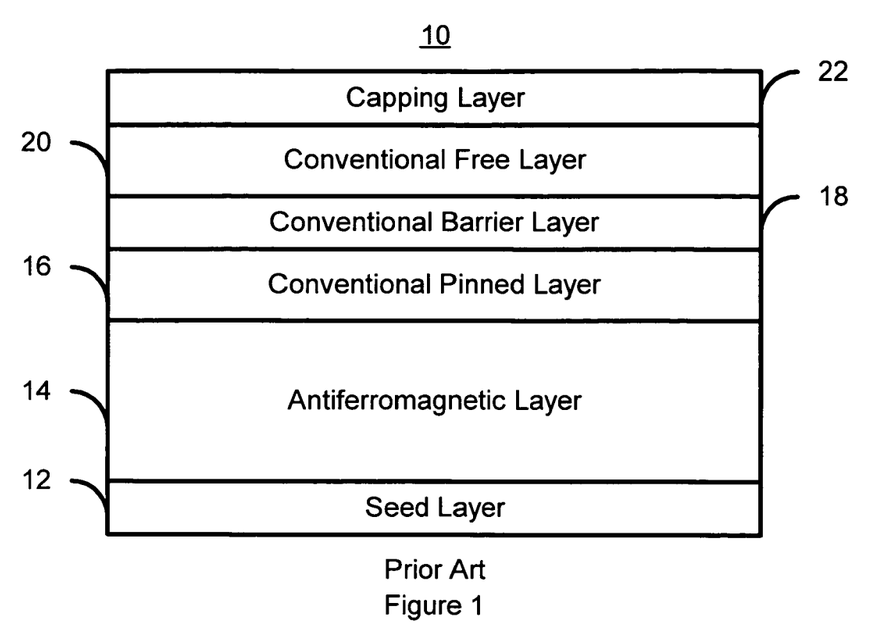
FIG. 1 is a diagram of a conventional tunneling magnetoresistive element.

FIG. 1 depicts a conventional tunneling magnetoresistive (TMR) element 10. The conventional TMR element 10 includes a seed layer 12, an antiferromagnetic (AFM) layer 14, a conventional pinned layer 16, a conventional barrier layer 18, a conventional free layer 20, and a capping layer 22. The conventional pinned layer 16 may a synthetic pinned layer including two ferromagnetic layers (not shown) separated by a nonmagnetic conductive spacer layer (not shown) that is typically Ru. Similarly, the conventional free layer 20 be a multilayer structure including, but not limited to a synthetic free layer including two ferromagnetic layers (not shown) separated by a nonmagnetic conductive spacer layer (not shown) that is typically Ru.

Figure 2:
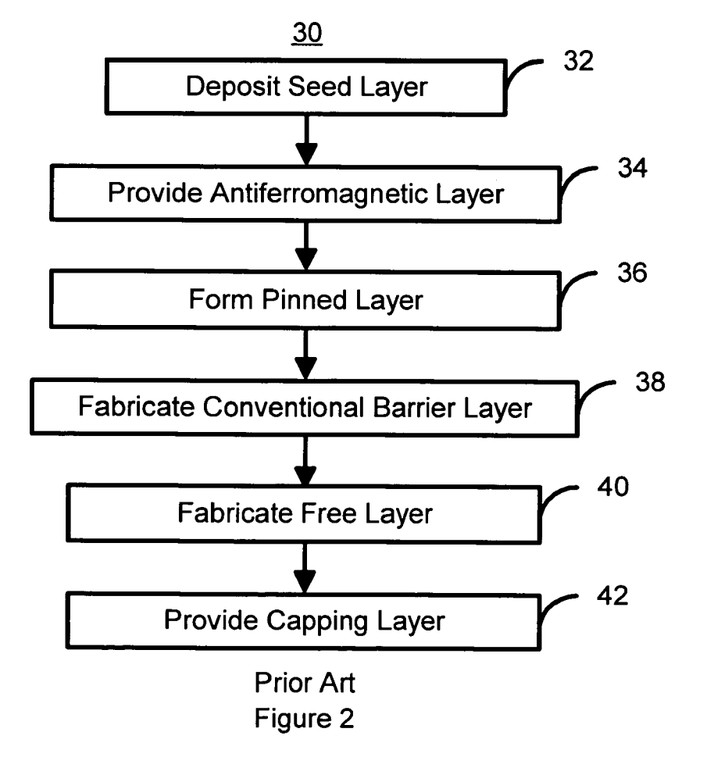
FIG. 2 is a flow chart depicting a conventional method for fabricating a conventional tunneling magnetoresistive element.

FIG. 2 depicts a conventional method 30 for providing the conventional TMR element 10. The seed layer 12 and AFM layer 14 are provided, via steps 32 and 34, respectively. The pinned layer 16 is formed, via step 36. Step 36 might include fabricating a synthetic pinned layer. The conventional barrier layer 18 is fabricated in step 38. Typically, step 38 includes depositing a metallic layer, such as Al, and completely oxidizing the metal in an oxygen environment to form a tunneling barrier. The free layer 20 is fabricated in step 40. The capping layer 22 is provided, via step 42.

Using the conventional method 30, the conventional TMR element 10 can be fabricated. One of ordinary skill in the art will readily recognize that it is desirable for the conventional barrier layer 18 to be on the order of ten Angstroms in thickness or less for current device applications. However, at such thicknesses of the conventional barrier layer 18, the conventional TMR element 10 may have an RA (resistance multiplied by cross-sectional area) that is too high for device applications. In particular, the TMR element 10 may have an RA on the order of one thousand Ohm-micrometers squared for a conventional barrier layer 10 on the order of nine to ten Angstroms. Furthermore, for conventional barrier layers 18 having a smaller thickness, the TMR effect may disappear. For example, some conventional TMR elements having a conventional barrier layer 18 that is seven Angstroms thick do not exhibit TMR. It is believed that the loss of TMR in such a thin conventional barrier layer 18 is due to defects, such as pinholes, which adversely affect the insulating nature of the conventional barrier layer 18. Consequently, the signal from such TMR elements is poor.

Figure 3:
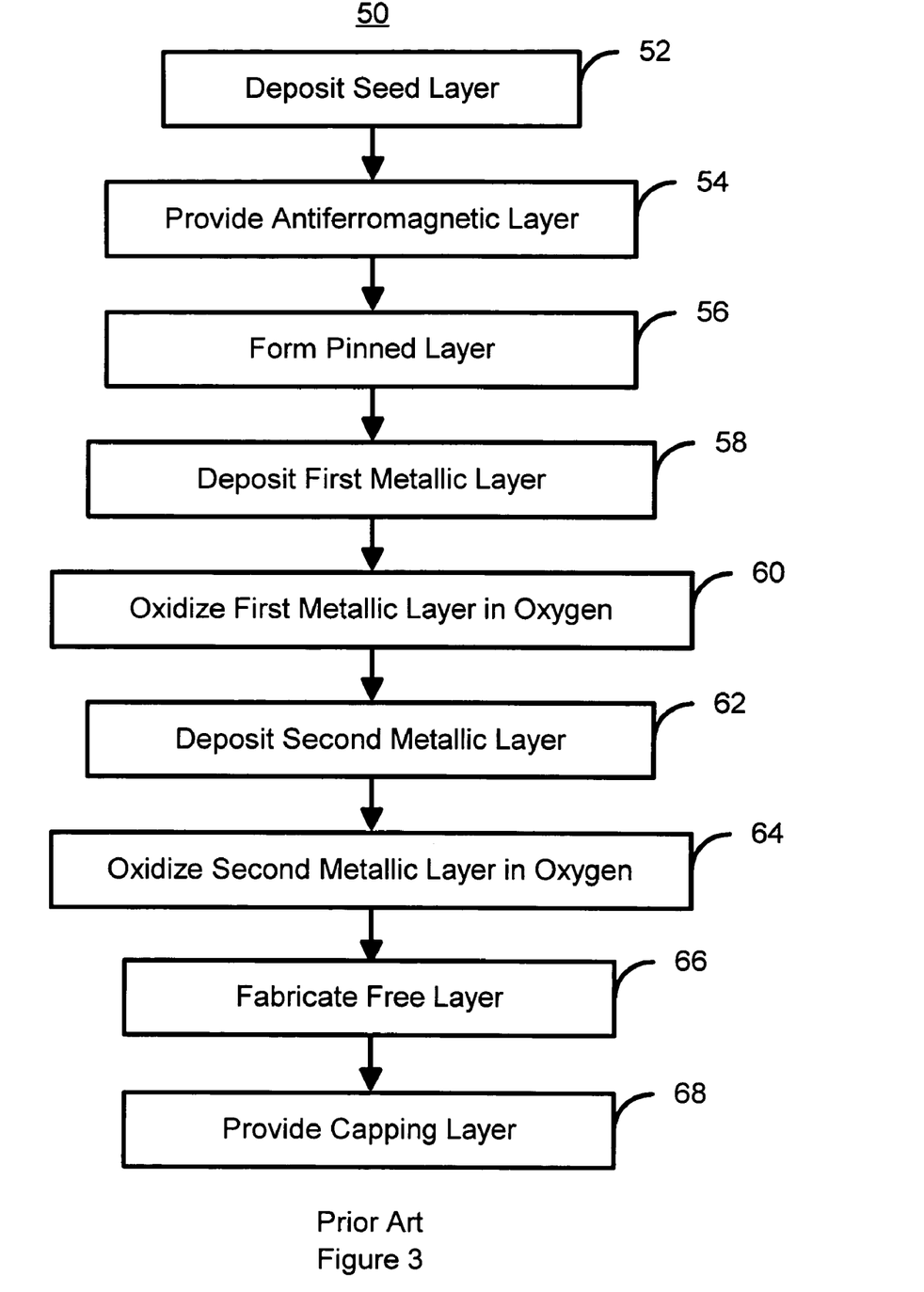
FIG. 3 is a high level diagram of a method for fabricating a conventional tunneling magnetoresistive element.

FIG. 3 depicts another, more recently developed method for providing a conventional TMR element. Thus, the method 50 is described in the context of the conventional TMR element 10. The conventional seed layer 12 and conventional AFM layer 14 are provided, via steps 52 and 54, respectively. The conventional pinned layer 16 is also fabricated, via step 56. Steps 58, 60, 62, and 64 are used to form the conventional barrier layer 18. A first metallic layer is deposited, via step 58. The thickness of this first metallic layer is less than the total thickness of the metal needed to form the conventional barrier layer 18. This first metallic layer is then oxidized in an oxygen environment, via step 60. Thus, a first portion of the conventional barrier layer 18 is fabricated. A second metallic layer is deposited, then oxidized in an oxygen environment, via steps 62 and 64, respectively. Upon completion of step 74, the conventional barrier layer 18 has been fabricated. The free layer 20 is fabricated in step 66. The capping layer 22 is deposited, via step 68.

Using the more recent method 50, a conventional TMR element 10 can be fabricated. For the conventional barrier layer 18 formed using the method 50 and having a thickness of as low as seven Angstroms, TMR is still exhibited. Moreover, the resulting conventional barrier layer 18 has a lower RA. Although the method 50 functions well for its intended purpose, one of ordinary skill in the art will readily recognize that even lower RA is desired for device applications.

Accordingly, what is needed is a method and system for providing a TMR element having a lower RA that still exhibits a sufficient signal.

BRIEF SUMMARY OF THE INVENTION

The present invention provides a method and system for manufacturing a spacer layer in a magnetoresistive element. The spacer layer resides between a free layer and a pinned layer. The method and system comprise providing a first metallic layer and oxidizing the first metallic layer in a first environment including at least oxygen and a first gas inert with respect to the first metallic layer. The method and system further comprise providing a second metallic layer and oxidizing the second metallic layer in a second environment including at least oxygen and a first gas inert with respect to the first metallic layer.

According to the method and system disclosed herein, the present invention provides a method and system for fabricating a magnetoresistive element that can have reduced and repeatable magnetostriction.

DETAILED DESCRIPTION OF THE INVENTION

Figure 4:
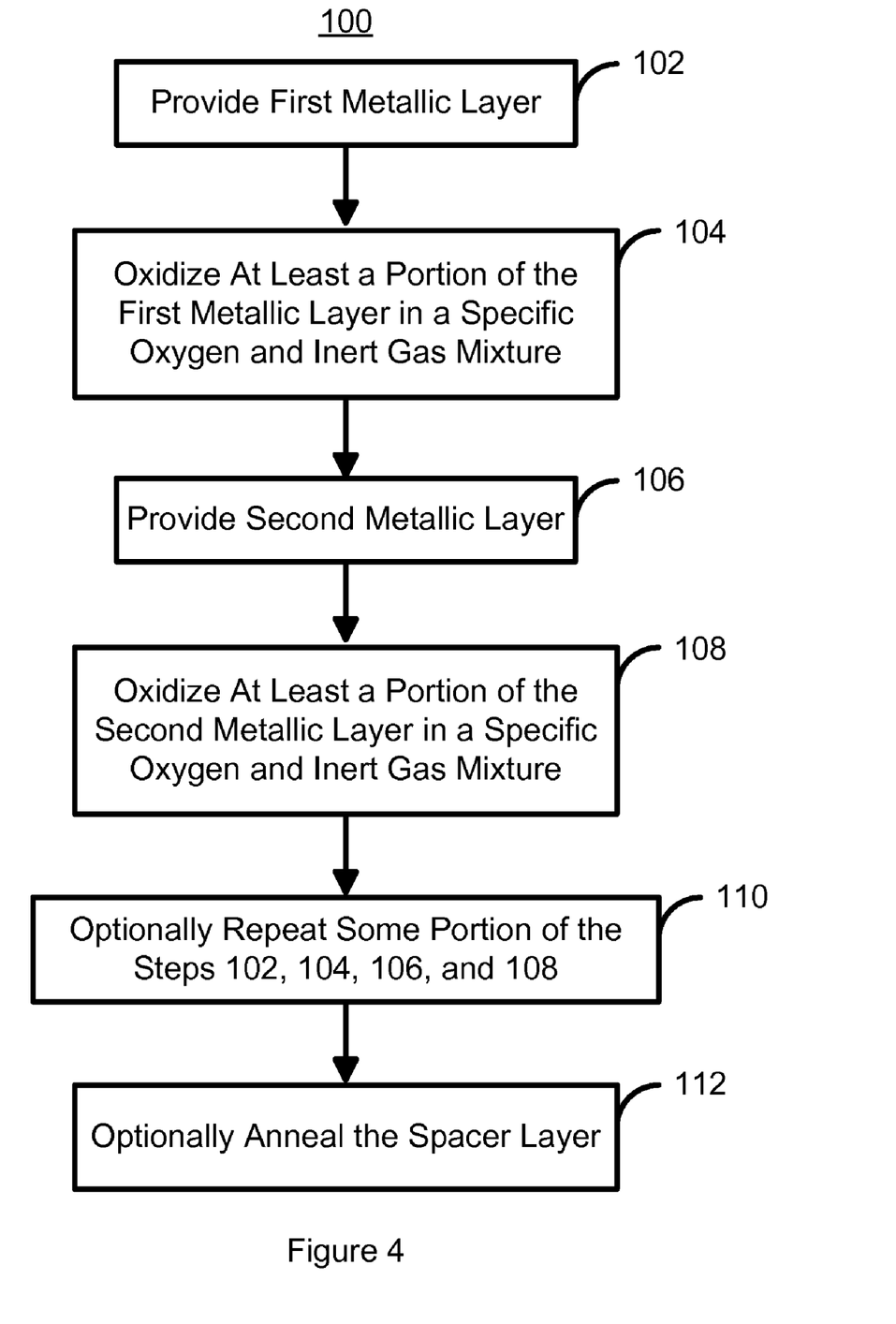
FIG. 4 is a high-level flow chart of a method for fabricating a spacer layer for a magnetoresistive element, such as a tunneling magnetoresistive element, in accordance with a preferred exemplary embodiment of the present invention.

FIG. 4 depicts a high-level flow chart of a method 100 for fabricating a spacer layer magnetoresistive element, such as a TMR element, according to a preferred exemplary embodiment of the present invention. However, the method 100 might also be for manufacturing other magnetoresistive elements, including but not limited to current-perpendicular-to-plane (CPP) giant magnetoresistance (GMR) elements. The method 100 preferably commences after a portion of the magnetoresistive element has been fabricated. For example, for a structure having a bottom-pinned layer, the method 100 commences after the pinned layer has been fabricated but before the free layer has been provided. Alternatively, for a top pinned structure, the method 100 might start after the free layer has been provided but before the pinned layer has been fabricated.

A first metallic layer is provided, via step 102. A number of different metals might be used for step 102. For a TMR element, the metallic layer might include aluminum, hafnium, or zirconium. For another element, such as a CPP GMR element, the metallic layer might also include chromium or copper. For example, both Al and Cu might be deposited for such an element. Thus, there is no requirement that the metallic layer have only a single constituent. The first metallic layer also has a thickness that is less than the total thickness of the desired layer being formed. For example, for a TMR element having a barrier layer nine Angstroms thick, the first metallic layer has a thickness of less than nine Angstroms and preferably on the order of five to six Angstroms. The first metallic layer is oxidized in an environment including oxygen and a gas inert with respect to the constituent(s) of the first metallic layer, via step 104. In a preferred embodiment, the gas essentially consists of Ar. In one embodiment, less than or equal to three percent of oxygen is used. In another embodiment, between one half and one and a half percent of oxygen is used. The remaining ninety-seven percent, or between ninety-eight and a half and ninety-nine and a half percent, is made up of the gas(es) that are inert to the constituent(s) of the first metallic layer. Also in a preferred embodiment, the gas and the oxygen are premixed, before being introduced to the first metallic layer. Moreover, the oxidation taking place is preferably natural oxidation, in which the first metallic layer is simply exposed to the mixture of oxygen and the inert gas at low pressure. Thus, the metallic layer is oxidized in step 104. For a TMR element, all of the first metallic layer is oxidized in step 104. For a CPP GMR magnetoresistive element, although all of the first metallic layer is oxidized in step 104, subsequent processing is capable of removing the oxygen from at least part of the first metallic layer. For example, for a first metallic layer including Cu and Al, both the Cu and Al are oxidized in step 104. However, a subsequent anneal may remove at least some portion of the oxygen from the Cu, leaving conductive channels in an insulating matrix. In the case of another magnetoresistive element, only a portion of the metallic layer might be oxidized in step 104.

A second metallic layer is provided, via step 106. A number of different metals might be used in step 106. For a TMR element, the metallic layer might include aluminum, hafnium, or zirconium. For another element, such as a CPP GMR element, the metallic layer might also include chromium or copper. For example, both Al and Cu might be deposited for such an element. Thus, there is no requirement that the metallic layer have only a single constituent. Although not required, in a preferred embodiment, the constituent(s) of the second metallic layer match the constituent(s) of the first metallic layer. The second metallic layer also has a thickness that is less than the total thickness of the desired layer being formed. For example, for a TMR element having a barrier layer nine Angstroms thick, the second metallic layer has a thickness of less than nine Angstroms and preferably on the order of two to three Angstroms. The second metallic layer is oxidized in an environment including oxygen and a gas inert with respect to the constituent(s) of the second metallic layer, via step 108. In a preferred embodiment, the gas essentially consists of Ar. In one embodiment, less than or equal to three percent of oxygen is used. In another embodiment, between one half and one and a half percent of oxygen is used. The remaining ninety-seven percent, or between ninety-eight and a half and ninety-nine and a half percent, is made up of the gas(es) that are inert to the constituent(s) of the first metallic layer. Also in a preferred embodiment, the gas and the oxygen are premixed, before being introduced to the first metallic layer. Moreover, the oxidation taking place is preferably natural oxidation, in which the second metallic layer is simply exposed to the mixture of oxygen and the inert gas at low pressure. Thus, the second metallic layer is oxidized in step 108. For a TMR element and CPP GMR element, the entire second metallic layer is oxidized in step 108. However, for another magnetoresistive element, only a portion of the metallic layer might be oxidized in step 108. At least the steps 102 and 104 of the method 100 may optionally be repeated in order to build up the thickness of the entire layer being fabricated, via step 110. For example, for a CPP GMR element, at least the steps 102, 104; and preferably the steps 102, 104, 106, and 108 of the method 100 would preferably be repeated at least once. Also in a preferred embodiment, the thickness of each metallic layer would be approximately four monolayers or less. Such thicknesses might be measured during fabrication using tools such as an ellipsometer or x-ray fluorescence. In such embodiments, an optional anneal may also be performed, via step 112. However, for a TMR element, the steps 110 and 112 are omitted. In addition, although the thickness of the barrier layer formed using the method 100 is preferably on the order of ten Angstroms or less, layers having a total thickness on the order of approximately twenty-five Angstroms or less can also be fabricated.

Figure 5:
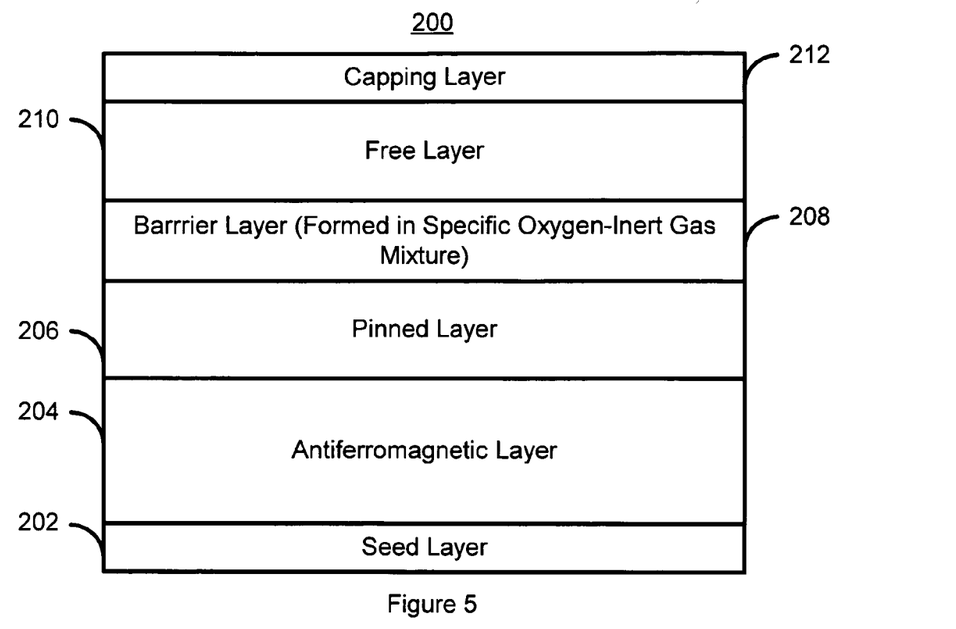
FIG. 5 depicts a magnetoresistive element, a TMR element, in accordance with an exemplary embodiment of the present invention.

FIG. 5 depicts a magnetoresistive element, a TMR element 200, in accordance with an exemplary embodiment of the present invention. The magnetoresistive element 200 includes at least a pinned layer 206, a spacer layer 208, and a free layer 210. Although shown as a simple layer, the pinned layer 206 may have another structure such as a synthetic pinned layer including ferromagnetic layers (not shown) separated by a conductive, nonmagnetic spacer layer that is typically Ru. Although depicted as a simple layer, the free layer 210 could have another structure such as a synthetic layer a synthetic pinned layer including ferromagnetic layers (not shown) separated by a conductive, nonmagnetic spacer layer that is typically Ru. In a preferred embodiment, the free layer 210 has a bilayer structure. Also in a preferred embodiment, materials having a high spin polarization are used for the ferromagnetic layers 206 and 210. In particular, materials having a spin polarization of greater than forty percent are used. For example, CoFe, particularly $Co_{90}Fe_{10}$, $CO_{75}Fe_{25}$, or $CO_{50}Fe_{50}$, and/or Heusler alloys may be utilized. Also depicted are an AFM layer 204 that is used pin the magnetization of the pinned layer 206, seed layer(s) 202, and a capping layer 212. Moreover, although a bottom-pinned structure 200 is depicted, nothing prevents the use of a top-pinned structure.

The spacer layer 208 is a tunneling barrier layer. In addition, the barrier layer 208 is depicted as being a single constituent layer. However, the barrier layer 208 is actually formed in accordance with the present invention. Thus, the barrier layer 208 is fabricated by providing a first metallic layer, oxidizing the metallic layer in an environment including oxygen and a gas that is inert with respect to the first metallic layer, providing a second metallic layer, and oxidizing the second metallic layer in another environment including oxygen and a gas that is inert with respect to the second metallic.

Using the method 100 to provide the TMR element 200 results in a magnetoresistive element that has a lower RA, yet still exhibits TMR at low thicknesses of the barrier layer 208. In particular, an RA of less than three has been achieved for barrier thicknesses less than nine Angstroms while preserving TMR.

Figure 6:
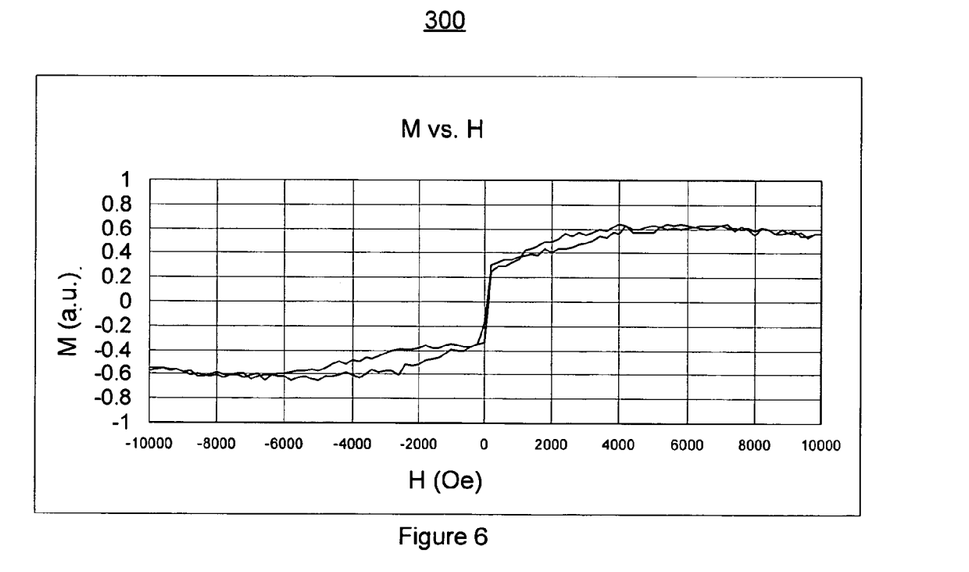
FIG. 6 is a graph depicting an M-H loop of a magnetoresistive element in accordance with an exemplary embodiment of the present invention.
Figure 7:
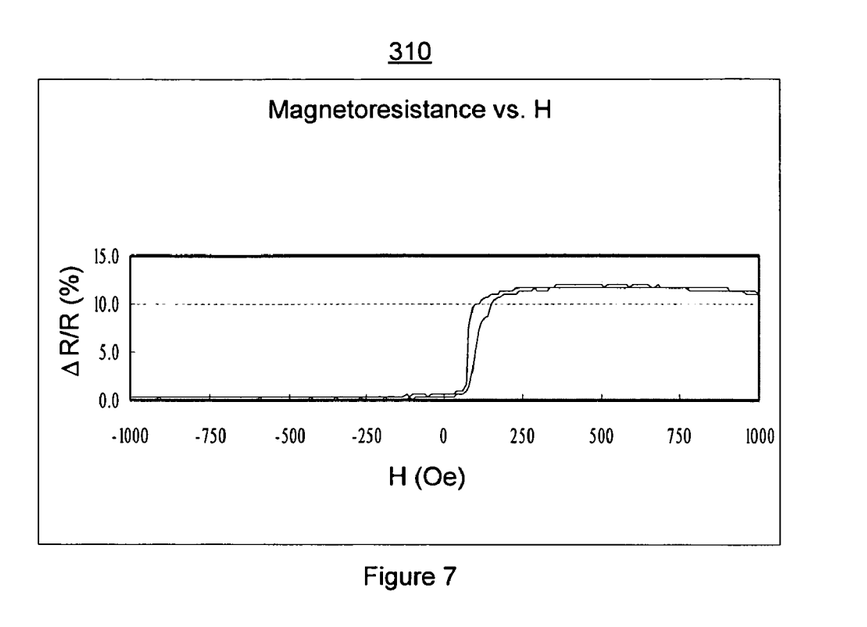
FIG. 7 is a graph depicting magnetoresistance vs. H for a magnetoresistive element in accordance with an exemplary embodiment of the present invention.
Figure 8:
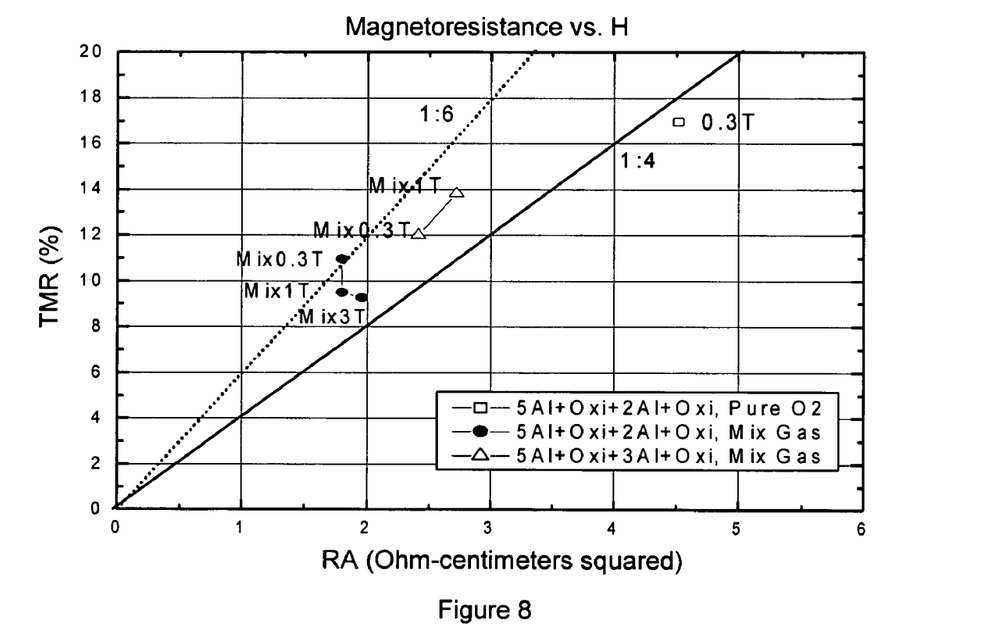
FIG. 8 is a graph depicting RA versus TMR for a magnetoresistive element in accordance with an exemplary embodiment of the present invention.

FIGS. 6-8 more clearly illustrate the properties of the TMR element 200 in accordance with an exemplary embodiment of the present invention. FIG. 6 is a graph 300 depicting an M-H loop of a TMR element in accordance with an exemplary embodiment of the present invention. FIG. 7 is a graph 310 depicting magnetoresistance vs. H for a TMR element in accordance with an exemplary embodiment of the present invention. FIG. 8 is a graph 320 depicting RA versus TMR for a TMR element in accordance with an exemplary embodiment of the present invention. Referring to FIGS. 5-8, the samples used in obtaining the data for the graphs 300, 310, and 320 were bottom-pinned TMR elements, such as the TMR element 200. The samples included one hundred and forty Angstroms of PtMn for the AFM layer 204. The pinned layer 206 was synthetic, including 8.4 Angstroms of Ru sandwiched between a lower layer of CoFe twenty Angstroms thick, and an upper layer of CoFe twenty-two Angstroms thick. The barrier layer 208 included $Al_2O_3$ having a variable thickness, t, of between approximately seven and nine Angstroms. The barrier layer 208 was formed by oxidizing first and second layers of metallic aluminum in an environment including a premixture of one percent oxygen and essentially ninety-nine percent Ar, and a pressure of 0.3 Torr for approximately five minutes. The free layer 210 used was a bilayer including fifteen Angstroms of CoFe topped by thirty Angstroms of NiFe. A thirty Angstrom thick capping layer 212 was also used. For the graphs 310, 320, and 330, the TMR element 200 was used in a CPP configuration. Consequently, a top lead and a bottom lead (not shown in FIG. 5) were also used.

As can be seen from the graph 300, the free layer 210 and pinned layer 208 were magnetically decoupled. This indicates that the barrier layer 208 had sufficient insulating properties that TMR through the barrier layer 208 may be obtained. The graph 310 depicts the TMR versus field. As is evidenced by the graph 310, a TMR of approximately twelve percent was obtained. The corresponding RA was approximately 1.880 Ohm-micrometer squared. Moreover, the graph 320 clearly indicates not only that an RA of less than three was obtained, but also that oxidation in the mixture of oxygen and the gas improved the RA over oxidation in oxygen.

Figure 9:
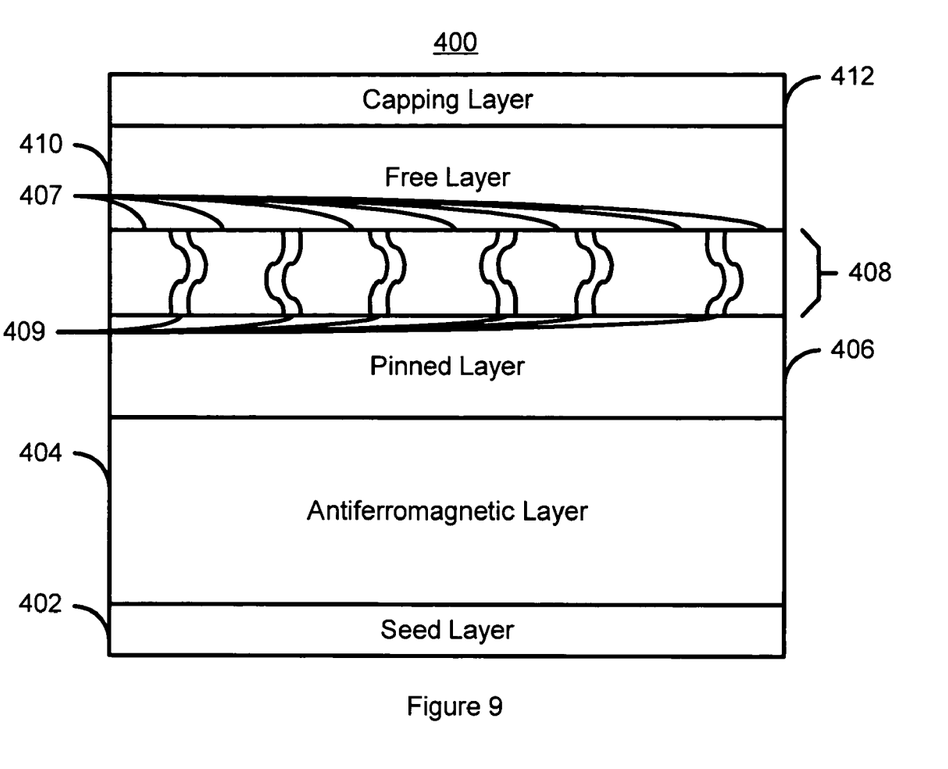
FIG. 9 depicts a magnetoresistive element in accordance with another exemplary embodiment of the present invention.

FIG. 9 depicts a magnetoresistive element in accordance with another exemplary embodiment of the present invention. The magnetoresistive element 400 is suitable for use as a CPP GMR magnetoresistive element. The magnetoresistive element 400 includes at least a pinned layer 406, a spacer layer 408, and a free layer 410. Although shown as a simple layer, the pinned layer 406 may have another structure such as a synthetic pinned layer including ferromagnetic layers (not shown) separated by a conductive, nonmagnetic spacer layer that is typically Ru. Although depicted as a simple layer, the free layer 410 could have another structure such as a synthetic layer a synthetic pinned layer including ferromagnetic layers (not shown) separated by a conductive, nonmagnetic spacer layer that is typically Ru. Also in a preferred embodiment, materials having a high spin polarization are used for the ferromagnetic layers 406 and 410. In particular, materials having a spin polarization of greater than forty percent are used. For example, CoFe, particularly $CO_{90}Fe_{10}$, $CO_{75}Fe_{25}$, or $CO_{50}Fe_{50}$, and/or Heusler alloys may be utilized. Also depicted are an AFM layer 404 that is used pin the magnetization of the pinned layer 406, seed layer(s) 402, and a capping layer 412. Moreover, although a bottom-pinned structure 400 is depicted, nothing prevents the use of a top-pinned structures.

The spacer layer 408 is a current confined layer that is formed in accordance with an exemplary embodiment of the present invention. Thus, the spacer layer 408 is fabricated at least by providing a first metallic layer, oxidizing the metallic layer in an environment including oxygen and a gas that is inert with respect to the first metallic layer, providing a second metallic layer, and oxidizing the second metallic layer in another environment including oxygen and a gas that is inert with respect to the second metallic. To form the spacer layer 408, these metallic layer providing and oxidizing steps may also be repeated until the spacer layer 408 has the desired thickness. For the spacer layer 408, the metallic layer preferably has multiple constituents, for example Al and Cu. After oxidation in the environment including oxygen and the inert gas, the Al and the Cu are oxidized. However, the anneal performed in step 112 pulls oxygen from the Cu, leaving the Cu in a metallic form. Consequently, the spacer layer 408 includes an insulating portion 407 and a metallic portion 409. The insulating portion 407 is, for example, alumina, while the metallic portion 409 may be Cu or Ag. Thus, the method 100 can be used not only to provide low RA TMR elements, such as the TMR element 200, but also other magnetoresistive elements, such as the CPP GMR element 400, in which at least a portion of the spacer layer 408 is oxidized.

We claim:

1. A method for manufacturing a spacer layer in a magnetoresistive element, the spacer layer residing between a free layer and a pinned layer, comprising;
   providing a first metallic layer;
   oxidizing the first metallic layer in a first environment including at least oxygen and a first gas inert with respect to the first metallic layer;
   providing a second metallic layer;
   oxidizing the second metallic layer in a second environment including at least the oxygen and a second gas inert with respect to the second metallic layer.

2. The method of claim 1 wherein at least one of the oxygen and the first gas and the oxygen and the second gas are premixed.

3. The method of claim 2 wherein at least one of the first environment and the second environment includes less than or equal to three percent of the oxygen.

4. The method of claim 1 wherein at least one of the first gas and the second gas consists essentially of Ar.

5. The method of claim 4 wherein at least one of the first environment and the second environment includes less than or equal to three percent of the oxygen.

6. The method of claim 5 wherein the at least one of the first environment and the second environment includes between one half and one and one half percent oxygen.

7. The method of claim 1 wherein the spacer layer has a thickness of less than twenty-five Angstroms.

8. The method of claim 1 wherein at least one of the free layer and the pinned layer has a spin polarization of greater than or equal to forty percent.

9. The method of claim 8 wherein the at least one of the free layer and the pinned layer include at least one of $Co_{90}Fe_{10}$, $CO_{75}Fe_{25}$, and $CO_{50}Fe_{50}$.

10. The method of claim 1 wherein at least one of the first metallic layer and the second metallic layer include at least one of aluminum, hafnium, chromium, copper, and zirconium.

11. The method of claim 1 wherein the first metallic layer providing further includes:

forming less than four monolayers of the first metallic layer.

12. The method of claim 11 wherein the second metallic layer providing further includes:

forming less than four monolayers of the second metallic layer.

13. The method of claim 12 further comprising:

repeating the first metallic layer providing, the first metallic layer oxidizing, the second metallic layer providing, and the second metallic layer oxidizing to provide the spacer layer having a desired thickness.

14. A method for manufacturing a spacer layer in a magnetoresistive element, the spacer layer residing between a free layer and a pinned layer, comprising;

providing a first metallic layer;

oxidizing the first metallic layer in a first environment including a first premixture of oxygen and argon, the first premixture including between one half and one and one-half percent oxygen;

providing a second metallic layer;

oxidizing the second metallic layer in a second environment including a second premixture of the oxygen and the argon, the second premixture including between one half and one and one-half percent oxygen;

wherein the spacer layer has a thickness of less than between two and twenty Angstroms.

* * * * *